United States Patent [19]
Yang

[11] Patent Number: 6,106,629
[45] Date of Patent: Aug. 22, 2000

[54] IMPURITY DOPING APPARATUS

[75] Inventor: Joon-Young Yang, Seoul, Rep. of Korea

[73] Assignee: LG. Philips LCD Co., Ltd., Seoul, Rep. of Korea

[21] Appl. No.: 09/434,118

[22] Filed: Nov. 5, 1999

[30] Foreign Application Priority Data

Nov. 6, 1998 [KR] Rep. of Korea ...................... 98-47557

[51] Int. Cl.$^7$ ..................................................... H01J 37/36
[52] U.S. Cl. ..................................... 118/725; 250/492.21
[58] Field of Search .................................. 118/725, 726, 118/723 EB, 723 CB; 250/492.21

[56] References Cited

U.S. PATENT DOCUMENTS 5,574,280  11/1996  Fuji et al. ........................... 250/492.21

*Primary Examiner*—Shrive Beck
*Assistant Examiner*—Sylvia R. MacArthur

*Attorney, Agent, or Firm*—Long, Aldridge & Norman LLP

[57] ABSTRACT

An impurity doping apparatus for fabricating a liquid crystal display simplifies processes for heating a substrate and doping the substrate with impurities by providing: a substrate supporter on which the substrate is mounted, a first gun disposed above and at a fixed distance from the substrate supporter for supplying a heating gas for heating the substrate, a second gun adjacent to the first gun which dopes the heated with impurity ions, a transferring part for moving the first and second guns to a horizontal or vertical direction, a driver providing the transferring part with a driving force to the horizontal or vertical direction, and a controller controlling an moving operation of the transferring part.

The apparatus: improves productivity; causes no heat damage to the substrate, since the process is carried out at low temperature; simplifies the total process by skipping an activating process accompanied by an impurity-ion doping step; and reduces the total volume of the apparatus, as no separate heating or cooling means is required, thereby also decreasing the total cost for the process.

30 Claims, 4 Drawing Sheets

IMPURITY DOPING APPARATUS

This application claims the benefit of Korean Patent Application No. 1998-47557, filed on Nov. 6, 1998, which is hereby incorporated by reference.

BACKGROUND OF THE INVENTION

1. Field of the Invention

The present invention relates to an impurity doping apparatus for fabricating a liquid crystal display which simplifies processes for heating a substrate and doping it with impurities such as when a glass substrate is pre-heated to a predetermined temperature and the pre-heated substrate is doped with impurities.

2. Discussion of the Related Art

FIG. 1 is a first embodiment of an impurity doping apparatus according to a related art, FIG. 2 is a second embodiment of an impurity doping apparatus according to a related art, and FIG. 3 is a third embodiment of an impurity doping apparatus according to a related art.

Referring to FIG. 1, the first embodiment I is comprised of a heating chamber 10 for heating a substrate 16-1 to a predetermined temperature, a process chamber 12 for doping a pre-heated substrate 16-2 with impurity ions, and a cooling chamber 19 for cooling down a substrate 16-3 having been doped with impurity ions.

A heating means 15 such as a heater or a heating coil is placed outside the heating chamber 10, and the substrate 16-1, having been placed on a substrate supporter 14-1, is placed into the heating chamber 10. Then, the heating chamber 10 is set up to be heated by the heating means 15 to a predetermined temperature.

A substrate supporter 14-2, where a substrate 16-2 having been heated to a predetermined temperature is placed, is located at the lower part of the process chamber 12, and a doping means 18 with impurity ions is located at the upper part of the process chamber 12.

A cooling means 17 such as a cooling tube through which a cooling water or a cooling gas flows is placed in the cooling chamber 19 which is set up to cool down a substrate 16-3 having been doped with impurity ions to a predetermined temperature.

In the following description, a process for doping a substrate with impurity ions using an impurity doping apparatus having the above construction according to a related art is explained.

A substrate is transferred to the heating chamber 10, and the transferred substrate 16-1 is heated by the heating means 15 to a predetermined temperature. The preheated substrate 16-2 is placed on the substrate supporter 14-2 in the process chamber 20, and the substrate 16-2 is doped with impurity ions by the doping means 18. Then, the substrate 16-3, having been doped with impurity ions, is transferred to the cooling chamber 19 to be cooled down by the cooling means 17.

FIG. 2 is a second embodiment of an impurity doping apparatus II according to a related art.

Referring to FIG. 2, the impurity doping apparatus II comprises a first process chamber 20 for doping a substrate 26-1 with impurity ions, and a second process chamber 29 for cooling down a substrate 26-2 having been doped with impurity ions.

A substrate supporter 24-1 having a heating means 22 inside is placed at the lower part of the first process chamber 20, and an impurity doping means 28 for a doping process with impurity ions is placed at the upper part of the first process chamber 20. A power supply 23 connected electrically to the heating means 22 supplies electricity. A cooling means 27, such as a cooling tube through which a cooling water or a cooling gas flows, is placed in the first cooling chamber 29 which is set up to cool down a substrate 26-2 having been doped with impurity ions to a predetermined temperature.

In an impurity doping apparatus having the above construction according to the second embodiment of a related art, the substrate 26-1 is placed on the substrate supporter 24-1 in the first process chamber 20. Then the substrate 26-1 is heated by the heating means 22, such as a hot coil, to a predetermined temperature. The heated substrate 26-1 is doped with impurity ions by the doping means 28 in the first process chamber 20. The substrate 26-2 having been doped with impurity ions is transferred to the substrate supporter 24-2 in the second process chamber 29, and then the substrate 26-2 is cooled down by the cooling means 27.

FIG. 3 is a third embodiment of an impurity doping apparatus III according to a related art.

Referring to FIG. 3, an impurity doping apparatus III comprises a first process chamber 30 in which a process of scanning a substrate 36-1 with a laser is carried out, and a second process chamber 32 in which a process of doping a substrate 36-2 having been scanned with a laser is carried out.

A substrate supporter 34-1 is placed at the lower part of the first process chamber 30 and an irradiating laser supplying means 37 is placed at the upper part of the first process chamber 30. A substrate supporter 34-2 is placed at the lower part of the second process chamber 32, and an impurity doping means 38 supplying impurity ions is placed at the upper part of the second process chamber 32.

In the impurity doping apparatus III according to the third embodiment of a related art, the substrate 36-1 is placed on the substrate supporter 34-1 in the first process chamber 30, and crystallization is achieved by a laser scanning process by means of the laser supplying means 37. An arrow in the drawing indicates a direction in which the laser supplying means 37 moves. Then, the crystallized substrate is transferred to the substrate supporter 34-2 in the second process chamber 32. There, the crystallized substrate 36-2 is doped with impurity ions injected from the impurity doping means 38.

However, the above-mentioned impurity doping means according to related arts have complicated processes because the step of heating a substrate and the other step of doping with impurities are processed separately. Moreover, the doping means requires a large volume for the respective heating means and cooling means.

SUMMARY OF THE INVENTION

Accordingly, the present invention is directed to an impurity doping apparatus that substantially obviates one or more of the problems due to limitations and disadvantages of the related art.

An object of the present invention is to provide an impurity doping apparatus which simplifies a process by carrying out steps of heating a substrate and doping with impurities simultaneously.

Another object of the present invention is to provide an impurity doping apparatus which occupies a minimal volume.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, the present invention includes a substrate supporter on which a substrate is mounted, a first gun disposed at a predetermined distance from the substrate supporter wherein the first gun supplies a heating gas for heating the substrate, a second gun disposed adjacent to the first gun, wherein the second gun dopes with impurity ions the substrate having been supplied with the heating gas, a transferring part for moving the first and second guns in a horizontal or vertical direction above the substrate, a driver providing the transferring part with driving forces in the horizontal or vertical direction, and a controller controlling the movement of the transferring part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, an example of which is illustrated in the accompanying drawings.

Figure 1:
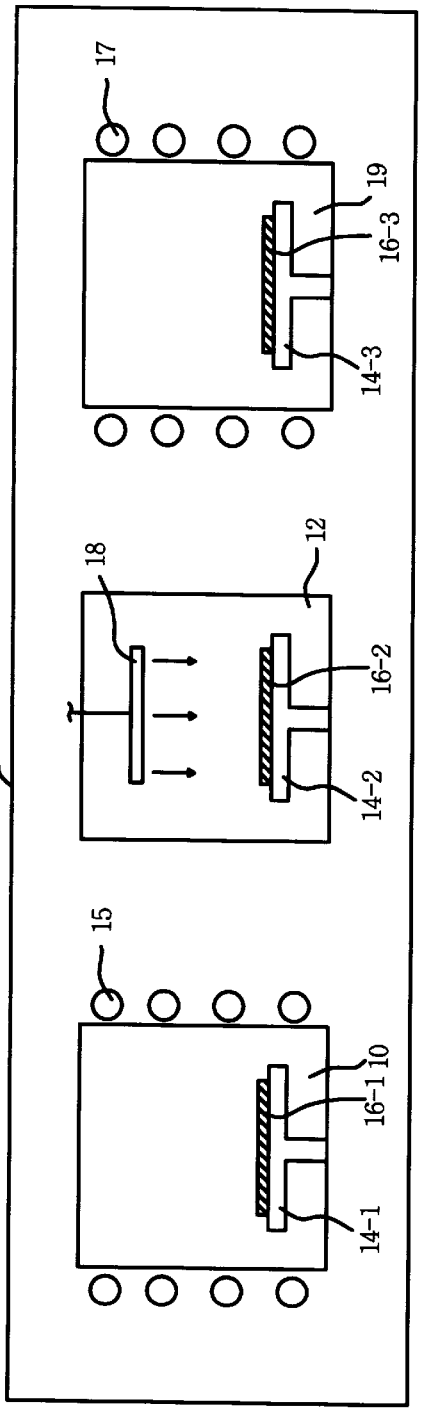
FIG. 1 is a first embodiment of an impurity doping apparatus according to a related art.
Figure 2:
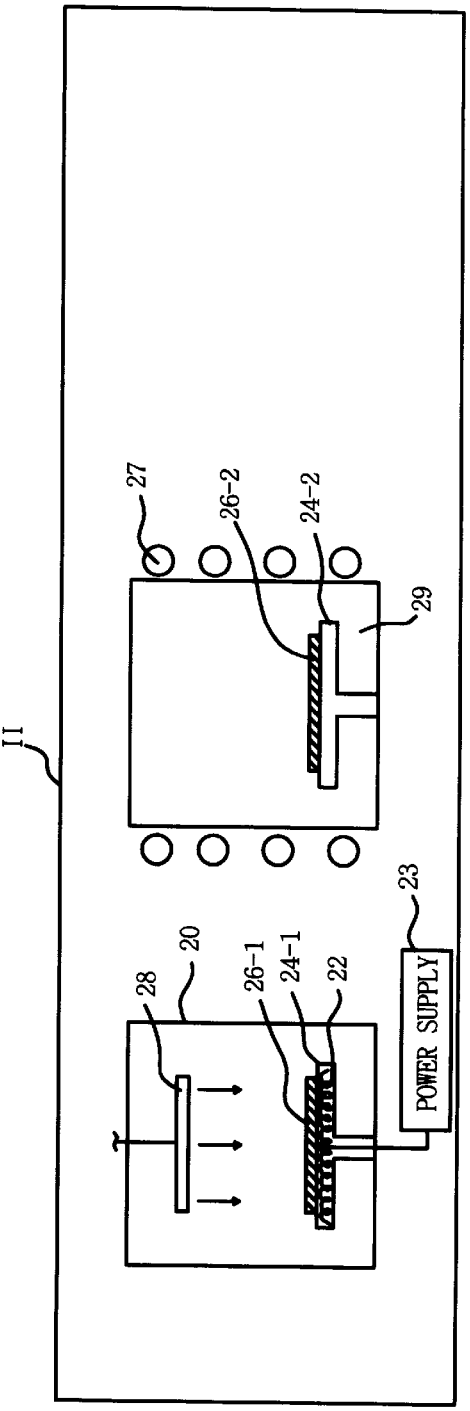
FIG. 2 is a second embodiment of an impurity doping apparatus according to a related art.
Figure 3:
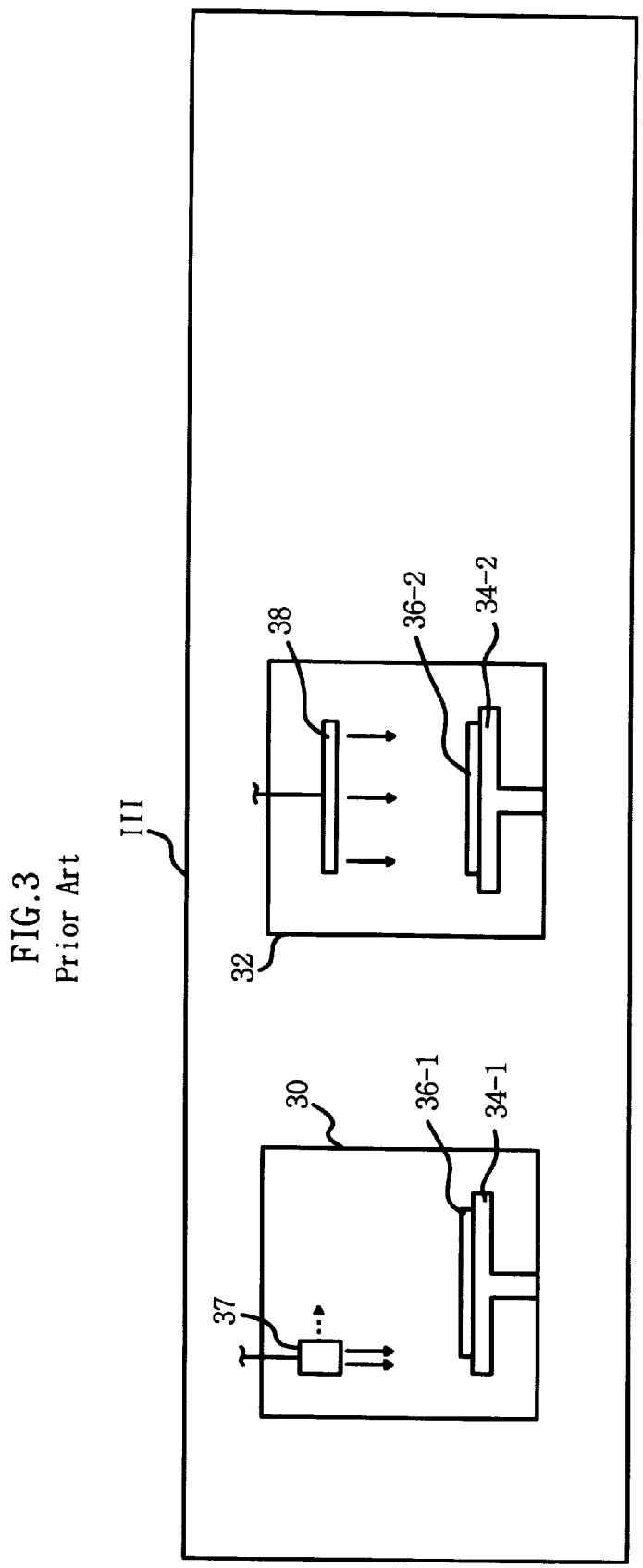
FIG. 3 is a third embodiment of an impurity doping apparatus according to a related art.
Figure 4:
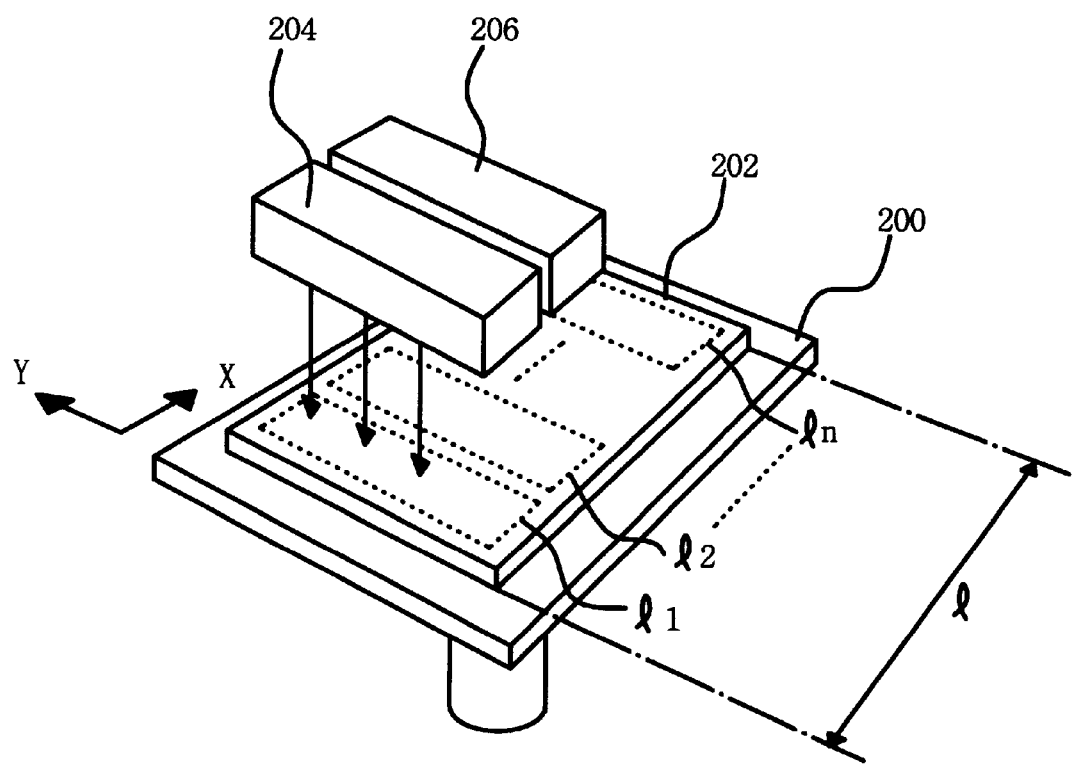
FIG. 4 shows a schematic three-dimensional partial view of an impurity doping apparatus according to the present invention.
Figure 5:
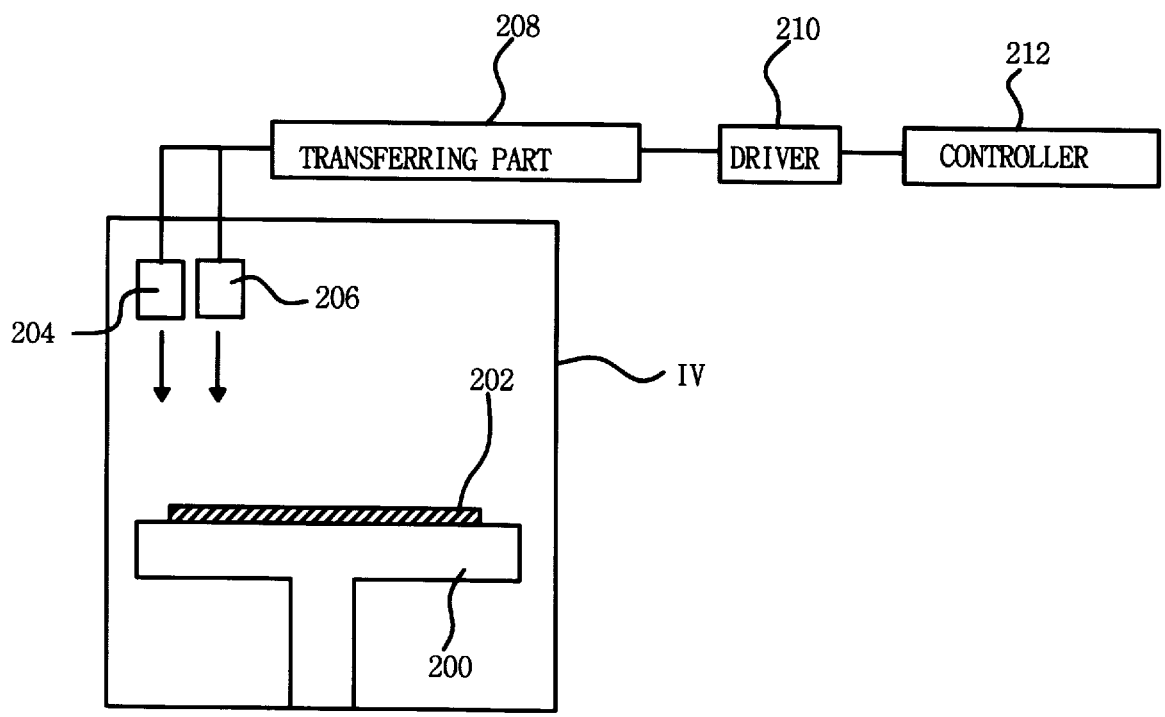
FIG. 5 shows a cross-sectional view of an impurity doping apparatus according to the present invention.

FIG. 4 shows a schematic three-dimensional partial view of an impurity doping apparatus according to the present invention, and FIG. 5 shows a cross-sectional view of an impurity doping apparatus according to the present invention.

Referring to FIG. 4 and FIG. 5, an impurity doping apparatus IV according to the present invention comprises a substrate supporter 200 on which a substrate 202 is placed, a first gun 206 which is placed at a predetermined distance from the substrate supporter 200 and supplies the substrate 202 with a heating gas, a second gun 204 which is adjacent to the first gun 206 and dopes a predetermined potion of the substrate having been supplied with the heating gas, a transferring part 208 which moves the first and second guns 206 and 204 in a horizontal (X-axis) or vertical (Y-axis) direction above the substrate 202 and substrate supporter 200, a driver 210 which drives the transferring part 208, and a controller 212 for controlling the movement of the transferring part 208.

In the impurity doping apparatus, when the driver 210 is turned on, the transferring part 208 receives a driving force of the driver 210 and moves the first and second guns 206 and 204 in a horizontal (X-axis) or vertical (Y-axis) direction over the substrate 202, as shown in FIG. 4. The controller 212 controls the sequential transfer of the second gun 204 after the first gun 206 has been transferred.

Preferably, the X-axis and Y-axis are perpendicular to each other and define an X-Y plane parallel to and above the top surface of the substrate 202. Also, preferably, each of the X-axis and Y-axis are substantially parallel to the sides of the top surface of substrate 202, as shown in FIG. 4. Preferably, the first and second guns 206 and 204 maintain a fixed distance from the substrate supporter 200 while being transferred in the horizontal (X-axis) and vertical (Y-axis) directions.

In the following description, a process of doping a substrate with impurities using of an impurity doping apparatus IV according to the present invention is explained.

The substrate 202 is placed on the substrate supporter 200. In this case, the substrate 202 is about to be doped with impurities, for instance, such that a polycrystalline or amorphous silicon layer as an active layer is formed for fabricating transistors of a liquid crystal display.

A predetermined part of the substrate 202 is heated partially by supplying a heating gas such as hydrogen ($H_2$) or the like through the first gun 206.

The hydrogen ($H_2$) heating gas is dissolved into hydrogen plasma (H+) having fixed energy. The energy turns into thermal energy when the plasma collides with a predetermined part of the substrate. The surface temperature of the predetermined part of the substrate having been impacted with the hydrogen plasma rises by the transformed energy up to a temperature of between 200° C.–300° C. to heat the substrate locally. This principle is applied to the present invention to use hydrogen gas as a heating gas.

The first and second guns 206 and 204 which maintain a predetermined separation from each other move in one direction (for example, the X-axis of FIG. 4). A first impurity-doped region 11 is formed by doping with the second gun 204 the part of the substrate having been heated by the first gun 206. Impurity ions injected by the second gun 204 are either P type impurities (e.g., boron) or N type impurities (e.g., phosphor or As).

In this case, the heating gas from the first gun 206 is applied to a predetermined part of the substrate adjacent to the first impurity-doped region 11 as soon as the first and second guns 206 and 204, maintaining a fixed distance each other, move simultaneously. Thus, the predetermined part of the substrate adjacent to the first impurity-doped region 11 is heated locally. Then, a second impurity-doped region 12 is formed by doping with the second gun 204 the heated part of the substrate adjacent to the first impurity-doped region 11.

By the above steps, the first, second, . . . , Nth impurity-doped regions 11, 12, . . . In are formed.

If necessary, the steps of supplying heating gases and doping with impurity ions may be carried out repeatedly, after transferring the first and second guns in the Y-axis direction. In this case, the total transferred displacement is determined by the controller 212 to be less than or equal to the total width of the substrate 202. And the transfer intervals of the first and second guns 206 and 204 are set up by the controller 212 much the same as before.

With the above method, an impurity doping means of the present invention needs no extra heating means, as the supply of high energy hydrogen gases and the doping with impurity ions occur simultaneously, and it is possible to skip an activating process accompanied after by the impurity-ion doping process.

The present invention improves productivity since a single process provides both effects of heating a substrate and doping with impurity ions. Also, there is no damage to a substrate caused by heat since the process is carried out at a low temperature. The total process is simplified by skipping an activating process accompanied by an impurity-ion doping step. Moreover, the total volume of the apparatus for the present invention is reduced as no extra heating or cooling means is required, and therefore the total cost for the process is also decreased.

It will be apparent to those skilled in the art that various modifications and variation can be made in the impurity doping apparatus of the present invention without departing from the spirit or scope of the invention. Thus, it is intended that the present invention cover the modifications and variations of this invention provided they come within the scope of the appended claims and their equivalents.

What is claimed is:

1. An impurity doping apparatus, comprising:
a substrate supporter on which a substrate is mounted;
a first gun disposed at a predetermined distance from the substrate supporter, wherein the first gun supplies a heating gas for heating the substrate;
a second gun disposed adjacent to the first gun, wherein the second gun dopes with impurity ions the substrate having been supplied with the heating gas;
a transferring part for transferring the first and second guns in a horizontal or vertical direction;
a driver providing the transferring part with a driving force in the horizontal or vertical direction; and
a controller controlling movement of the transferring part.

2. The impurity doping apparatus according to claim 1, wherein the first and second guns maintain a fixed separation from each other as the first and second guns are transferred.

3. The impurity doping apparatus according to claim 1, wherein a total transferred displacement of the first and second guns is equal to or less than a width of the substrate.

4. The impurity doping apparatus according to claim 1, wherein the heating gas is hydrogen gas.

5. The impurity doping apparatus of claim 4, wherein the hydrogen gas becomes a plasma and the plasma collides with a predetermined portion of the substrate, heating the predetermined portion of the substrate.

6. The impurity doping apparatus according to claim 1, wherein the second gun supplies P type impurities.

7. The impurity doping apparatus according to claim 1, wherein the second gun supplies N type impurities.

8. The impurity doping apparatus according to claim 1, wherein the first and second guns maintain a predetermined distance from the substrate supporter while being transferred in the horizontal or vertical direction.

9. The impurity doping apparatus of claim 1, wherein the transferring part sequentially transfers the second gun after transferring the first gun.

10. The impurity doping apparatus of claim 1, wherein said apparatus sequentially heats and dopes a portion of the substrate mounted on said substrate supporter without movement of the substrate.

11. An impurity doping apparatus, comprising:
supporting means for supporting a substrate;
heating means for heating the substrate, said heating means disposed at a predetermined distance above a top surface of said means for supporting the substrate;
doping means for doping the substrate with impurity ions, said doping means disposed adjacent to and separated by a fixed distance from said heating means; and
transferring means for transferring said heating means and said doping means in an x-y plane parallel to said top surface of said means for supporting the substrate.

12. The impurity doping apparatus according to claim 11, further comprising controlling means for controlling the transferring means.

13. The impurity doping apparatus according to claim 12, wherein the heating means and doping means maintain a fixed separation from each other as the heating means and doping means are transferred.

14. The impurity doping apparatus according to claim 11, wherein a total transferred displacement of the heating means and doping means is equal to or less than a width of the substrate.

15. The impurity doping apparatus according to claim 11, wherein the heating means supplies hydrogen gas.

16. The impurity doping apparatus of claim 15, wherein the hydrogen gas becomes a plasma and the plasma collides with a predetermined portion of the substrate, heating the predetermined portion of the substrate.

17. The impurity doping apparatus according to claim 11, wherein the doping means supplies P type impurities.

18. The impurity doping apparatus according to claim 11, wherein the doping means supplies N type impurities.

19. The impurity doping apparatus according to claim 11, wherein the heating means and doping means maintain a predetermined distance from the supporting means while being transferred.

20. The impurity doping apparatus of claim 11, wherein the transferring part sequentially transfers the doping means after transferring the heating means.

21. The impurity doping apparatus of claim 11, wherein said apparatus sequentially heats and dopes a portion of the substrate mounted on the supporting means without movement of the substrate.

22. An impurity doping apparatus, comprising:
a substrate supporter whereon a substrate is mounted;
a heating gun disposed above and at a fixed distance from a top surface of the substrate supporter;
a doping gun adjacent to the heating gun disposed above and at a fixed distance from the top surface of the substrate supporter;
a transferring part for transferring the heating gun and doping gun in a first direction while maintaining the heating gun and doping gun at a fixed distance above the top surface of the substrate supporter.

23. The impurity doping apparatus of claim 22, further comprising a controller for controlling the transferring part.

24. The impurity doping apparatus of claim 22, wherein the transferring part also transfers the heating gun and doping gun in a second direction substantially perpendicular to the first direction while maintaining the heating gun and doping gun each at a fixed distance above the top surface of the substrate supporter.

25. The impurity doping apparatus according to claim 22, wherein the heating gun and the doping gun maintain a fixed separation from each other as the heating gun and the doping gun are transferred.

26. The impurity doping apparatus according to claim 22, wherein the heating gun supplies hydrogen gas.

27. The impurity doping apparatus of claim 26, wherein the hydrogen gas becomes a plasma and the plasma collides with a predetermined portion of the substrate, heating the predetermined portion of the substrate.

28. The impurity doping apparatus according to claim 22, wherein the doping gun supplies P type impurities.

29. The impurity doping apparatus according to claim 22, wherein the doping gun supplies N type impurities.

30. The impurity doping apparatus of claim 22, wherein said apparatus sequentially heats and dopes a portion of the substrate mounted on said substrate supporter without movement of the substrate.

* * * * *